US012672493B2

(12) United States Patent
Kim et al.

(10) Patent No.: US 12,672,493 B2
(45) Date of Patent: Jun. 30, 2026

(54) SUBSTRATE PROCESSING DEVICE AND SUBSTRATE PROCESSING METHOD

(71) Applicant: SEMES CO., LTD.,
Chungcheongnam-do (KR)

(72) Inventors: Min Jung Kim, Bucheon-si (KR);
Moon Sik Choi, Cheonan-si (KR)

(73) Assignee: SEMES CO., LTD.,
Chungcheongnam-Do (KR)

( * ) Notice: Subject to any disclaimer, the term of this patent is extended or adjusted under 35 U.S.C. 154(b) by 222 days.

(21) Appl. No.: 18/769,749

(22) Filed: Jul. 11, 2024

(65) Prior Publication Data

US 2025/0069897 A1 Feb. 27, 2025

(30) Foreign Application Priority Data

Aug. 23, 2023 (KR) ........................ 10-2023-0110659

(51) Int. Cl.
*H10P 50/66* (2026.01)
*H10P 72/00* (2026.01)

(52) U.S. Cl.
CPC ........ *H10P 50/667* (2026.01); *H10P 72/0424* (2026.01)

(58) Field of Classification Search
None
See application file for complete search history.

(56) References Cited

U.S. PATENT DOCUMENTS

| | | | | |
|---|---|---|---|---|
| 5,882,433 | A * | 3/1999 | Ueno | H10P 72/0406 |
| | | | | 134/33 |
| 7,467,635 | B2 * | 12/2008 | Satoshi | H10P 72/0424 |
| | | | | 134/25.4 |
| 9,355,883 | B2 | 5/2016 | Hohenwarter | |
| 2003/0119318 | A1 * | 6/2003 | Niuya | G03F 7/422 |
| | | | | 257/E21.228 |
| 2007/0093071 | A1 * | 4/2007 | Verhaverbeke | H10P 72/0468 |
| | | | | 430/269 |
| 2009/0280649 | A1 * | 11/2009 | Mayer | C25D 17/14 |
| | | | | 156/345.23 |
| 2010/0236579 | A1 * | 9/2010 | Araki | B08B 3/10 |
| | | | | 134/94.1 |

FOREIGN PATENT DOCUMENTS

KR 10-2010-0000266 A 1/2010

* cited by examiner

*Primary Examiner* — Shamim Ahmed
(74) *Attorney, Agent, or Firm* — Carter, DeLuca & Farrell LLP

(57) ABSTRACT

Disclosed is a substrate processing apparatus including: a support unit for supporting a substrate and rotating the substrate; a solution discharge unit for discharging a processing solution including a first material and a second material onto the substrate to remove a film on the substrate; and a controller for controlling the solution discharge unit, in which the controller sets, when the solution discharge unit discharges the processing solution to a first position and a second position on the substrate, a hydrogen ion concentration of the processing solution discharged to the first position to be different from a hydrogen ion concentration of the processing solution discharged to the second position, and the first position is a center of the substrate or is located closer to the center of the substrate than the second position.

8 Claims, 5 Drawing Sheets

| SUBSTRATE ROTATING OPERATION | ~S10 |
| PROCESSING SOLUTION DISCHARGING OPERATION | ~S20 |
| CLEANING OPERATION | ~S30 |
| DRYING FLUID PROCESSING OPERATION | ~S40 |

SUBSTRATE PROCESSING DEVICE AND SUBSTRATE PROCESSING METHOD

CROSS-REFERENCE TO RELATED APPLICATIONS

This application claims priority to and the benefit of Korean Patent Application No. 10-2023-0110659 filed in the Korean Intellectual Property Office on Aug. 23, 2023, the entire contents of which are incorporated herein by reference.

TECHNICAL FIELD

The present invention relates to a substrate processing apparatus and a substrate processing method that process a substrate.

BACKGROUND ART

To manufacture semiconductor devices, various processes, such as photography, deposition, ashing, etching, and ion implantation, are performed. In addition, before and after these processes are performed, a cleaning process of cleaning particles remaining on the substrate is performed.

The above processes may be performed in the state where a substrate supported on a support unit is rotated. For example, in a wet etching process among the etching processes, the substrate is etched by supplying a processing solution to the substrate rotated by a spin chuck.

As a result, the processing solution is discharged to the center of the rotating substrate and spreads to the edge by the centrifugal force of the rotating substrate to etch the entire substrate.

Since the processing solution is dispersed as it spreads from the center to the edge, the etch speed is different near the center and the edge. For this reason, the etch rate decreases from the center to the edge of the substrate, resulting in unbalanced etching of the center and the edge.

SUMMARY OF THE INVENTION

The present invention has been made in an effort to provide a substrate processing apparatus and a substrate processing method that prevents an unbalanced etch rate from a center of a substrate to an edge of the substrate.

The object of the present invention is not limited thereto, and other objects not mentioned will be clearly understood by those of ordinary skill in the art from the following description.

The present invention is not limited thereto, and other objects not mentioned will be clearly understood by those of ordinary skill in the art from the following description.

An exemplary embodiment of the present invention provides a substrate processing apparatus including: a support unit for supporting a substrate and rotating the substrate; a solution discharge unit for discharging a processing solution including a first material and a second material onto the substrate to remove a film on the substrate; and a controller for controlling the solution discharge unit, in which the controller sets, when the solution discharge unit discharges the processing solution to a first position and a second position on the substrate, a hydrogen ion concentration of the processing solution discharged to the first position to be different from a hydrogen ion concentration of the processing solution discharged to the second position, and the first position is a center of the substrate or is located closer to the center of the substrate than the second position According to the embodiment, the first material may be a liquid that etches the film, and the second material may be a liquid that activates the first material.

According to the embodiment, the first material may be a hydrogen peroxide solution, and the second material may be an alkaline solution.

According to the embodiment, the processing solution may have a content of the first material higher than a content of the second material.

According to the embodiment, the solution discharge unit may include a first nozzle for discharging the processing solution at the first position and a second nozzle for discharging the processing solution at the second position, and the substrate processing apparatus may include: a first material tank in which the first material is stored; a second material tank in which the second material is stored; a first supply line connected to the first nozzle; a second supply line connected to the second nozzle; a first branch line connected between the first material tank and the first supply line, and supplying the first material to the first supply line; a second branch line connected between the second material tank and the first supply line and supplying the second material to the first supply line; a third branch line connected between the first material tank and the second supply line, and supplying the first material to the second supply line; and a fourth branch line connected between the second material tank and the second supply line and supplying the second material to the second supply line, and a hydrogen ion concentration of the processing solution discharged from the second nozzle may be higher than a hydrogen ion concentration of the processing solution discharged from the first nozzle.

According to the embodiment, the substrate processing apparatus may further include: a first regulator which is installed in at least one of the first supply line, the first branch line, the second branch line, and regulates the hydrogen ion concentration of the processing solution discharged from the first nozzle by regulating the amount of mixing of the first material and the second material; and a second regulator which is installed in at least one of the second supply line, the third branch line, and the fourth branch line, and regulates the hydrogen ion concentration of the processing solution discharged from the second nozzle by regulating the amount of mixing of the first material and the second material.

According to the embodiment, a mixing ratio of the first material and the second material in the processing solution discharged at the first position may be set to a first ratio, a mixing ratio of the first material and the second material in the processing solution discharged at the second position may be set to a second ratio, and the first ratio and the second ratio are set such that a content of the second material may be 5% to 30% of a content of the first material.

According to the embodiment, the second ratio may be set such that the content of the second material is higher than the content of the second material in the first ratio.

According to the embodiment, the film may be a TiN layer.

According to the embodiment, the hydrogen ion concentration of the processing solution discharged at the second position may be higher than the hydrogen ion concentration of the processing solution discharged at the first position.

According to the embodiment, the second position may be located closer to an edge of the substrate than to a center position of the substrate, among the positions from the center position of the substrate to the edge of the substrate.

According to the embodiment, the solution discharge unit may include a plurality of nozzles, any one nozzle of the plurality of nozzles may discharge the processing solution at the first position, and another nozzle of the plurality of nozzles may discharge the processing solution at the second position.

Another embodiment of the present invention provides a substrate processing method of processing a substrate, the substrate processing method including: discharging a processing solution onto a rotating substrate to etch a film on the substrate, in which the processing solution includes a first material and a second material, and the first material is a material that etches the film, and the second material is a material that activates the first material, the processing solution is discharged to a first location on the substrate and a second location on the substrate, and a hydrogen ion concentration of the processing solution discharged at the first location is set to be different from a hydrogen ion concentration of the processing solution discharged at the second location.

According to the embodiment, the first position may be a center of the substrate, or a position closer to the center of the substrate than the second position, and the hydrogen ion concentration of the processing solution discharged at the second position may be higher than the hydrogen ion concentration of the processing solution discharged at the first position.

According to the embodiment, the first material may be a hydrogen peroxide solution, and the second material may be an alkaline solution.

According to the embodiment, the second position may be located closer to an edge of the substrate than to a center position of the substrate, among the positions from the center position of the substrate to the edge of the substrate.

According to the embodiment, a mixing ratio of the first material and the second material in the processing solution discharged at the first position may be set to a first ratio, a mixing ratio of the first material and the second material in the processing solution discharged at the second position may be set to a second ratio, and the first ratio and the second ratio are set such that a content of the second material may be 5% to 30% of a content of the first material.

According to the embodiment, the second ratio may be set such that the content of the second material is higher than the content of the second material in the first ratio.

According to the embodiment, the film may be a TiN layer.

Still another embodiment of the present invention provides a substrate processing method of processing a substrate, the substrate processing method including: discharging a processing solution onto a rotating substrate to etch a TiN film on the substrate, in which the processing solution includes a hydrogen peroxide solution and an alkaline solution, and the hydrogen peroxide solution is a material for etching the film, and the alkaline solution is a material for activating the hydrogen peroxide solution, the processing solution is discharged to a first location on the substrate and a second location on the substrate, and the first position is a center of the substrate, or a position closer to the center of the substrate than the second position, and the hydrogen ion concentration of the processing solution discharged at the second position is higher than the hydrogen ion concentration of the processing solution discharged at the first position, a mixing ratio of the first material and the second material in the processing solution discharged at the first position is set to a first ratio, a mixing ratio of the first material and the second material in the processing solution discharged at the second position is set to a second ratio, and the first ratio and the second ratio are set such that a content of the second material is 5% to 30% of a content of the first material, and the second ratio is set such that the content of the second material is higher than the content of the second material in the first ratio.

The present invention has the effect that the etch rate from the center of the substrate to the edge of the substrate is balanced, so that defects due to etch imbalance do not occur.

The effect of the present invention is not limited to the foregoing effects, and non-mentioned effects will be clearly understood by those skilled in the art from the present specification and the accompanying drawings.

DETAILED DESCRIPTION

Figure 1:
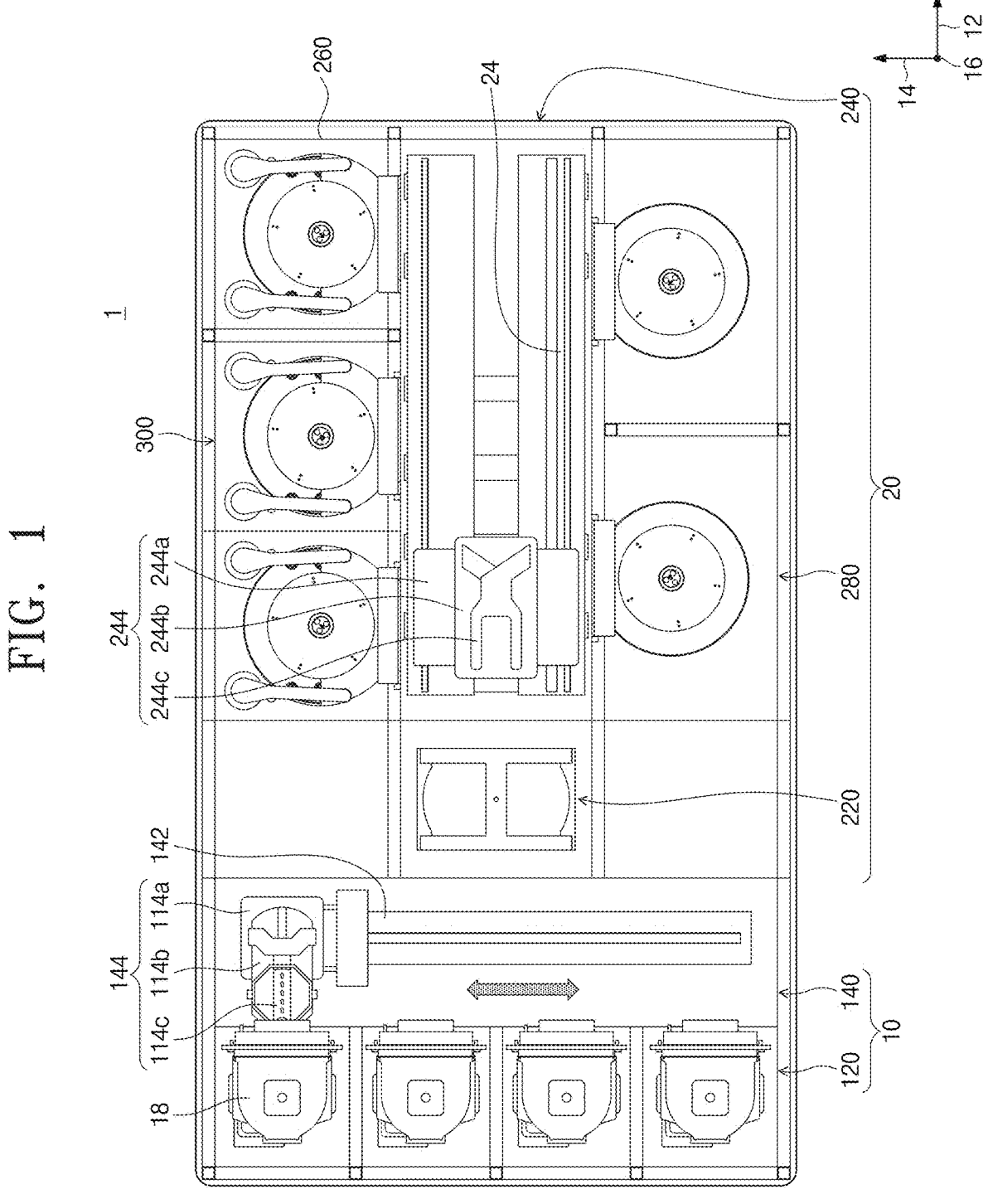
FIG. 1 is a top plan view illustrating a substrate processing facility according to an embodiment of the present invention.

Example embodiments will now be described more fully with reference to the accompanying drawings. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

When the term "same" or "identical" is used in the description of example embodiments, it should be understood that some imprecisions may exist. Thus, when one element or value is referred to as being the same as another element or value, it should be understood that the element or value is the same as the other element or value within a manufacturing or operational tolerance range (e.g., ±10%).

When the terms "about" or "substantially" are used in connection with a numerical value, it should be understood that the associated numerical value includes a manufacturing or operational tolerance (e.g., ±10%) around the stated numerical value. Moreover, when the words "generally" and "substantially" are used in connection with a geometric shape, it should be understood that the precision of the geometric shape is not required but that latitude for the shape is within the scope of the disclosure.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

In the present exemplary embodiment, a wafer will be described as an example of an object to be processed. However, the technical spirit of the present invention may be applied to devices used for other types of substrate processing, in addition to wafers.

Figure 2:
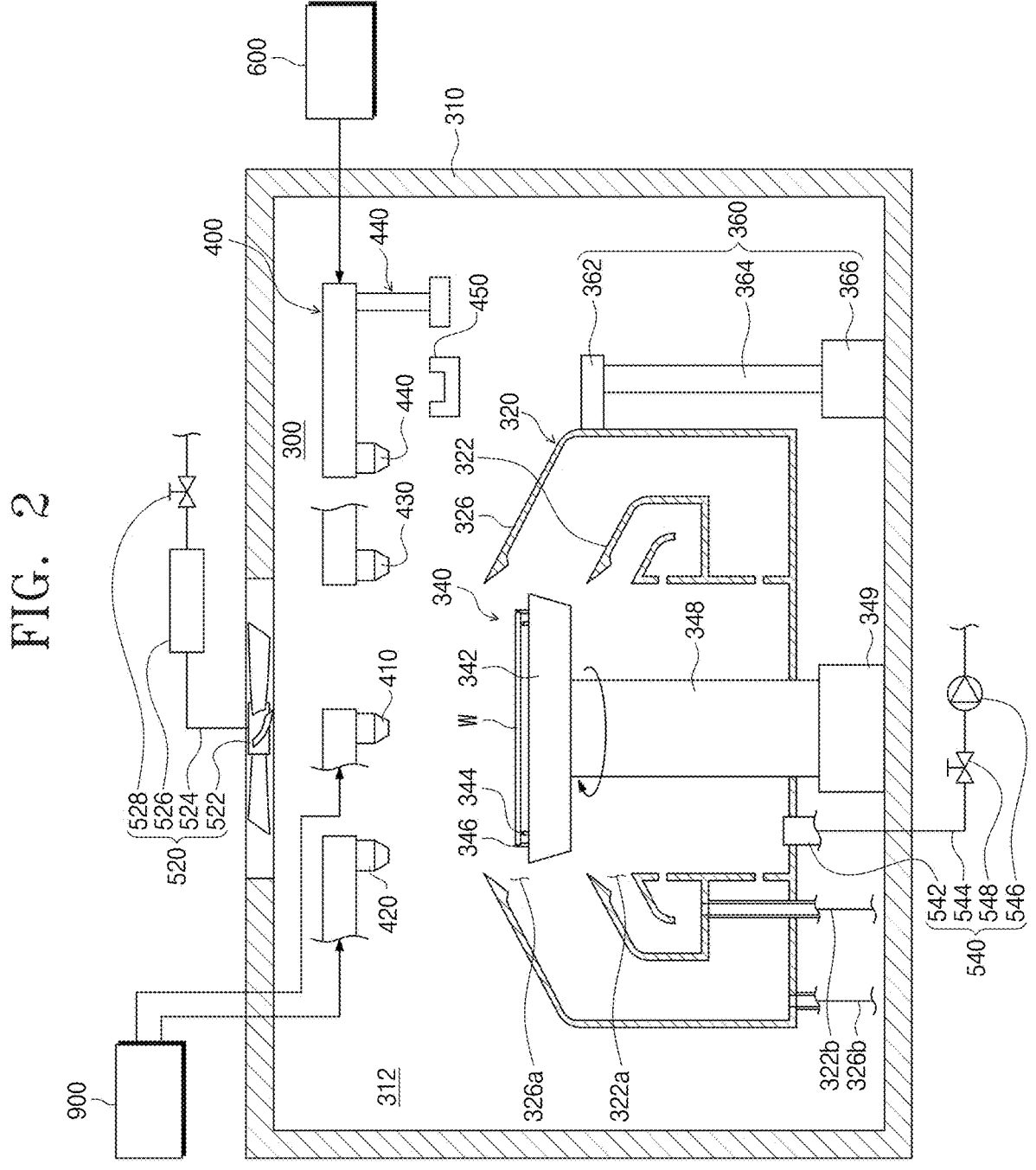
FIG. 2 is a cross-sectional view illustrating a substrate processing apparatus of FIG. 1.

FIG. 1 is a top plan view illustrating a substrate processing facility according to an embodiment of the present invention. FIG. 2 is a cross-sectional view illustrating a substrate processing apparatus of FIG. 1.

Referring to FIGS. 1 and 2, a substrate processing facility 1 includes an index module 10 and a process processing module 20, and the index module 10 includes a load port 120 and a transfer frame 140. The load port 120, the transfer frame 140, and the process processing module 20 are arranged in sequential rows. Hereinafter, a direction in which the load port 120, the transfer frame 140, and the process processing module 20 are arranged is referred to as a first direction 12, a direction perpendicular to the first direction 12 when viewed from above is referred to as a second direction 14, and a direction perpendicular to a plane including the first direction 12 and the second direction 14 is referred to as a third direction 16.

A carrier 18 in which a substrate W is accommodated is seated on the load port 120. A plurality of load ports 120 is provided, which are arranged in a row along the second direction 14. In FIG. 1, it is illustrated that four load ports 120 are provided. However, the number of load ports 120 may be increased or decreased depending on conditions, such as process efficiency and footprint of the process processing module 20. Slots (not illustrated) provided to support an edge of the substrate are formed in the carrier 18. The slots are provided in a plurality in the third directions 16, and the substrates are located in a carrier to be stacked while being spaced apart from each other along the third directions 16. As the carrier 18, a Front Opening Unified Pod (FOUP) may be used.

The process processing module 20 may include a buffer unit 20, a transfer chamber 240, and process chambers 260 and 280. The transfer chamber 240 is disposed so that a longitudinal direction thereof is parallel to the first direction 12. The process chambers 260 and 280 are disposed on opposite sides of the transfer chamber 240 in the second direction 14. The process chambers 260 may be provided to be symmetrical to each other relative to the transfer chamber 240. Some of the process chambers 260 and 280 are disposed along the longitudinal direction of the transfer chamber 240. Additionally, some of the process chambers 260 and 280 are arranged to be stacked on top of each other. That is, the process chambers 240 may be disposed in an array of A×B (A and B are natural numbers equal to or greater than 1) on opposite sides of the transfer chamber 240. Here, A is the number of process chambers 260 and 280 provided in a line along the first direction 12, and B is the number of process chambers 260 and 280 provided in a line along the third direction 16. When four or six process chambers 260 are provided on each of the opposite sides of the transfer chamber 240, the process chambers 260 and 280 may be disposed in an array of 2×2 or 3×2. The number of process chambers 260 and 280 may be increased or decreased. Unlike the foregoing, the process chamber 260 may be provided only to one side of the transfer chamber 240. In addition, the process chambers 260 and 280 may be provided as a single layer on one side and the opposite sides of the transfer chamber 240. In addition, the process chambers 260 and 280 may be provided in various arrangements unlike the above.

The process chambers 260 and 280 of the present exemplary embodiment may be categorized as including a cleaning chamber and a drying chamber. In this case, the cleaning chamber may be a substrate processing facility for cleaning the substrate, which will be described below, and the drying chamber may be a substrate processing facility for drying the substrate. The buffer unit 220 is disposed between the transfer frame 140 and the transfer chamber 240. The buffer unit 220 may provide a space in which the substrate W stays before the substrate W is transferred between the transfer chamber 240 and the transfer frame 140. The buffer unit 220 is provided with slots (not illustrated) in which the substrate W is placed therein, and the slots (not illustrated) are provided in plural to be spaced apart from each other along the third direction 16. In the buffer unit 220, a side facing the transfer frame 140 and a side facing the transfer chamber 240 are each open.

The transfer frame 140 transfers the substrate W between the carrier 18 seated at the load port 120 and the buffer unit 220. The transfer frame 140 is provided with an index rail 142 and an index robot 144. The index rail 142 is provided so that a longitudinal direction thereof is parallel to the second direction 14. The index robot 144 is installed on the index rail 142, and linearly moves in the second direction 14 along the index rail 142. The index robot 144 includes a base 144a, a body 144b, and an index arm 144c. The base 144a is installed to be movable along the index rail 142. The body 144b is coupled to the base 144a. The body 144b is provided to be movable in the third direction 16 on the base 144a. Further, the body 144b is provided to be rotatable on the base 144a. The index arm 144c is coupled to the body 144b and is provided to be movable forwardly and backwardly with respect to the body 144b. A plurality of index arms 144c is provided to be individually driven. The index arms 144c are disposed to be stacked in the state of being spaced apart from each other in the third direction 16. Some of the index arms 144c may be used when the substrate W is transferred from the process processing module 20 to the carrier 18, and another some of the plurality of index arms 144c may be used when the substrate W is transferred from the carrier 130 to the process processing module 20. This may prevent the particles generated from the substrate W before the process processing from being attached to the substrate W after the process processing in the process in which the index robot 144 loads and unloads the substrate W.

The transfer chamber 240 transfers the substrate W between the buffer unit 220 and the process chambers 260. A guide rail 242 and a main robot 244 are provided to transfer chamber 240. The guide rail 242 is disposed so that a longitudinal direction thereof is parallel to the first direction 12. The main robot 244 is installed on the guide rail 242 and linearly moved along the first direction 12 on the guide rail 242. The main robot 244 includes a base 244a, a body 244b, and a main arm 244c. The base 244a is installed to be movable along the guide rail 242. The body 244b is coupled to the base 244a. The body 244b is provided to be movable in the third direction 16 on the base 244a. Further, the body 244b is provided to be rotatable on the base 244a. The main arm 244c is coupled to the body 244b, and provided to be movable forwardly and backwardly with respect to the body 244b.

Hereinafter, a substrate processing apparatus 300 provided in the process chamber 260 will be described. In the present exemplary embodiment, the case where the substrate processing apparatus 300 performs a solution processing on the substrate will be described as an example. The solution processing further includes a process of cleaning a substrate.

FIG. 2 is a cross-sectional view illustrating a substrate processing apparatus of FIG. 1. Referring to FIG. 2, the substrate processing apparatus 300 further includes a chamber 310, a processing container 320, a support unit 340, a lifting unit 360, a solution discharge unit 400, an airflow formation unit 500, a solution supply unit 600, and a controller 900. The chamber 310 provides a processing space 312 in which a process for processing the substrate W is performed.

The processing container 320 is positioned in the processing space 312 and is provided in the shape of a cup with an open top. When viewed from above, the processing container 320 is positioned to overlap an exhaust pipe. The processing container 320 includes an internal collection container 322 and an external collection container 326. Each of the collection containers 322 and 326 collects a different processing solution from the processing solutions used in the process. The internal collection container 322 is provided in the shape of an annular ring surrounding the support unit 340, and the external collection container 326 is provided in the shape of an annular ring surrounding the inner collection container 322. An inner space 322a of the internal collection container 322 and a space 326a between the external collection container 326 and the internal collection container 322 function as inlets for the processing solution to flow into the internal collection container 322 and the external collection container 326, respectively. Collection lines 322b and 326b are connected to the bottom surfaces of the collection containers 322 and 326, respectively, to extend vertically in the down direction. Each of the collection lines 322b and 326b functions as a discharge pipe to discharge the processing solution that has been introduced through the respective collection containers 322 and 326. The discharged processing solution may be reused through an external processing solution regeneration system (not illustrated).

The support unit 340 is provided as a substrate support unit 340 for supporting and rotating the substrate W. The support unit 340 is disposed within the processing container 320. The substrate support unit 340 supports the substrate W and rotates the substrate W during the process progress. The support unit 340 includes a spin chuck 342, a support pin 344, a chuck pin 346, and a rotation shaft 348. The spin chuck 342 has a top surface that is substantially circular when viewed from the top. The rotation shaft 348 that is rotatable by a driver is fixedly coupled to the bottom surface of the spin chuck 342. In one example, the driver may be formed of a motor 349. A plurality of support pins 344 is provided. The support pins 344 are spaced apart on the edge portion of a top surface of the spin chuck 342 and protrude upwardly from the spin chuck 342. The support pins 334 are arranged in combination with each other to have an overall annular ring shape. The support pin 344 supports an edge of the rear surface of the substrate W so that the substrate W is spaced apart from the top surface of the spin chuck 2631 at a predetermined distance. A plurality of chuck pins 346 is provided. The chuck pins 346 are disposed to be further away from a center of the spin chuck 342 than the support pins 344. The chuck pin 346 is provided to protrude upwardly from the spin chuck 342. The chuck pin 346 supports a lateral portion of the substrate W to prevent the substrate W from laterally deviating from its stationary position when the support unit 340 is rotated. The chuck pin 346 is provided to be linearly movable between a standby position and a support position along a radial direction of the spin chuck 342. The standby position is a position further away from the center of the spin chuck 342 relative to the support position. When the substrate W is loaded into or unloaded from the support unit 340, the chuck pin 346 is positioned in the standby position, and when a process is being performed on the substrate W, the chuck pin 346 is positioned in the support position. In the support position, the chuck pin 346 is in contact with the lateral portion of the substrate W.

The lifting unit 360 regulates the relative height between the processing container 320 and the support unit 340. The lifting unit 360 linearly moves the processing container 320 in the upper and lower directions. As the processing container 320 is moved up and down, the relative height of the processing container 320 with respect to the support unit 340 changes. The lifting unit 460 includes a bracket 360, a moving shaft 362, and a driver 364. The bracket 362 is fixedly installed on the outer wall of the processing container 320, and a moving shaft 364, which is moved in the vertical direction by a driver 366, is fixedly coupled to the bracket 364. When the substrate W is placed on the support unit 340 or lifted from the support unit 340, the processing container 320 is lowered so that the support unit 340 protrudes above the processing container 320. Furthermore, when the process is in progress, the height of the processing container 320 is regulated so that the processing solution may flow into the preset collection containers 322 and 326 according to the type of processing solution that has been supplied to the substrate W.

As described above, the lifting unit 360 may move the support unit 340 in the upper and lower directions instead of the processing container 320.

The solution discharge unit 400 supplies various types of solution to the substrate W. The solution discharge unit 400 further includes a plurality of nozzles 410 to 440. Each nozzle is moved between a process position and a standby position by a nozzle position driver. The process position is defined herein as a position where the nozzles 410 to 430 are capable of discharging solution onto the substrate W positioned within the processing container 320, and the standby position is defined as a position where the nozzles 410 to 430 are waiting outside of the process position. According to an example, the process position may be a position where the nozzles 410 to 440 are capable of supplying solution to the center of the substrate W. For example, when viewed from above, the nozzles 410 to 440 may be moved linearly or axially to be moved between the process position and the standby position. The processing solution discharged from the solution discharge unit 400 to the substrate W may be a processing solution for processing the substrate W. Further, in the standby position, a return pipe 450 may be disposed under the fourth nozzle 440. The return pipe 450 collects the discharged processing solution when the fourth nozzle 440 discharges the processing solution for cleaning.

The plurality of nozzles 410 to 440 discharges different types of solution. The processing solution discharged from the nozzles 410 to 440 may include at least one of a chemical, a rinse solution, a cleaning solution, and a drying fluid. Referring to the embodiment of FIG. 2, the first nozzle 410 and the second nozzle 420 may be nozzles that discharge a processing solution that etches the substrate W. Additionally, the third nozzle 430 may be a nozzle that discharges a rinse solution. The rinse solution may be a solution capable of rinsing the chemicals remaining on the substrate W. For example, the rinse solution may be pure water. Further, the third nozzle 430 may be a nozzle that discharges the cleaning solution. The cleaning solution may be a solution that processes the support unit 340, the processing container 320, and the collection pipe 450 after processing the substrate W. For example, the cleaning solution may include a reducing agent capable of triggering oxidation-reduction reaction. Additionally, the fourth nozzle 440 may be a nozzle for discharging a drying fluid. The drying fluid may be provided as a liquid capable of replacing the residual rinse solution on the substrate W. The drying fluid may be a liquid having lower surface tension than the rinse solution. The drying fluid may be an organic solvent. The drying fluid may be isopropyl alcohol (IPA). The fourth nozzle 440 may be connected to the solution supply unit 600, which will be described later. The solution supply unit 600 is a device for storing drying fluid and for heating and supplying the stored drying fluid.

On the other hand, when an etch imbalance occurs from the center of the substrate W to an edge E1 of the substrate W, the processing solution discharged from the solution discharge unit 400 may increase the etch rate by increasing the hydrogen ion concentration for the area with a low etch rate. For example, the processing solution may be discharged at a hydrogen ion concentration such that hydrogen ion concentration discharged at the second position P1 of the substrate W is higher than the hydrogen ion concentration discharged at the first position C1 of the substrate W. For example, the processing solution may have a hydrogen ion concentration index PH of 7 at the second position P1 of the substrate W and a hydrogen ion concentration index PH of 3 at the first position C1. More specifically, in a state where the first nozzle 410 is located at the first position C1 of the substrate W and the second nozzle 420 is located at the second position P1 spaced apart from the first position C1 of the substrate W, the hydrogen ion concentration of the processing solution discharged from the second nozzle 420 may be discharged at a higher concentration than the hydrogen ion concentration of the processing solution discharged from the first nozzle 410. In this case, the processing solution discharged to the second position P1 of the substrate W may be more active than the processing solution discharged to the first position C1 of the substrate W, thereby increasing the etch rate towards the edge E1 region of the substrate W. Accordingly, the substrate W may have a similar etch rate from the first position C1 to the edge E1 region, thereby preventing poor etching due to etching imbalance. In this case, the second position P1 may be located closer to the edge E1 of the substrate W than the first position C1 of the substrate W among the positions from the first position C1 of the substrate W to the edge E1 of the substrate W. For example, for the substrate W having a radius of 150 mm, the second position P1 may optionally be located in a range of 80 mm to 145 mm spaced from the center of the substrate W toward the edge E1.

Further, as the processing solution, a mixture of a first material and a second material may be discharged to increase the hydrogen ion concentration for the edge E1 side of the substrate W compared to the hydrogen ion concentration at the first position C1 of the substrate W. In other words, the processing solution may include the first material and the second material. In one example, the first material may be a hydrogen peroxide solution and the second material may be an alkaline solution. Accordingly, the processing solution is discharged with the mixture of the first material and the second material to increase the activation of the first material by the second material, thereby increasing the etch rate of the substrate W. In this case, in the processing solution, the first material is mixed with a higher content than the content of the second material, which may increase the etch rate of the substrate W. In this case, as an example of the second material, the second material may be formed by including at least one of EKC liquid, BTS liquid, and TNE2 liquid. The processing solution including the first material and the second material may be discharged from each of the first nozzle 410 and the second nozzle 420. In this case, the content of the second material in the processing solution discharged from the second nozzle 420 may be greater than the content of the second material in the processing solution discharged from the first nozzle 410. In this case, the processing solution discharged from the first nozzle 410 may have a component ratio of the first material and the second material set to a first ratio, and the processing solution discharged from the first nozzle 410 may have a component ratio of the first material and the second material set to a second ratio, and the content of the second material in the second ratio is set to be higher than the content of the second material in the first ratio. The processing solution and mixing ratios will be described in more detail in the subsequent substrate processing method.

The airflow forming unit 500 forms a downward airflow in the processing space 312. The airflow forming unit 500 supplies airflow from an upper portion of the chamber 310 and exhausts airflow from a lower portion of the chamber 310. The airflow forming unit 500 further includes an airflow supply unit 520 and an exhaust unit 540. The airflow supply unit 520 and the exhaust unit 540 are positioned facing each other in the vertical direction.

The airflow supply unit 520 supplies gas in the downward direction. The gas supplied from the airflow supply unit 520 may be air from which impurities are removed. The airflow supply unit 520 further includes a fan 522, an airflow supply line 524, a supply valve 528, and a filter 526. The fan 522 is installed on the ceiling surface of the chamber 310. When viewed from above, the fan 522 is positioned to face the processing container. The fan 522 may be positioned to provide air toward the substrate W positioned within the processing container. The airflow supply line 524 is connected to the fan 522 to supply air to the fan 522. A supply valve 528 is installed in the airflow supply line 524 to regulate the amount of airflow supplied. The filter 526 is installed in the airflow supply line 524 to filter the air. For example, the filter 526 may remove particles and moisture contained in the air.

The exhaust unit 540 exhausts the processing space 312. The exhaust unit 540 further includes an exhaust pipe 542, a pressure reducing member 546, and an exhaust valve 548. The exhaust pipe 542 is installed on the bottom surface of the chamber 310 and is provided as a pipe to exhaust the processing space 312. The exhaust pipe 542 is positioned such that the exhaust port faces upwardly. The exhaust pipe 542 is positioned such that the exhaust port is in communication with the interior of the processing container. That is, the top of the exhaust pipe 542 is located within processing container. Accordingly, the downward airflow formed within the processing container is exhausted through the exhaust pipe 542.

The pressure reducing member 546 reduces pressure of the exhaust pipe 542. A negative pressure is formed in the exhaust pipe 542 by the pressure reducing member 546, which exhausts the processing container. The exhaust valve 548 is installed in the exhaust pipe 542 and opens and closes the exhaust port of the exhaust pipe 542. The exhaust valve 548 regulates the exhaust volume.

Figure 4:
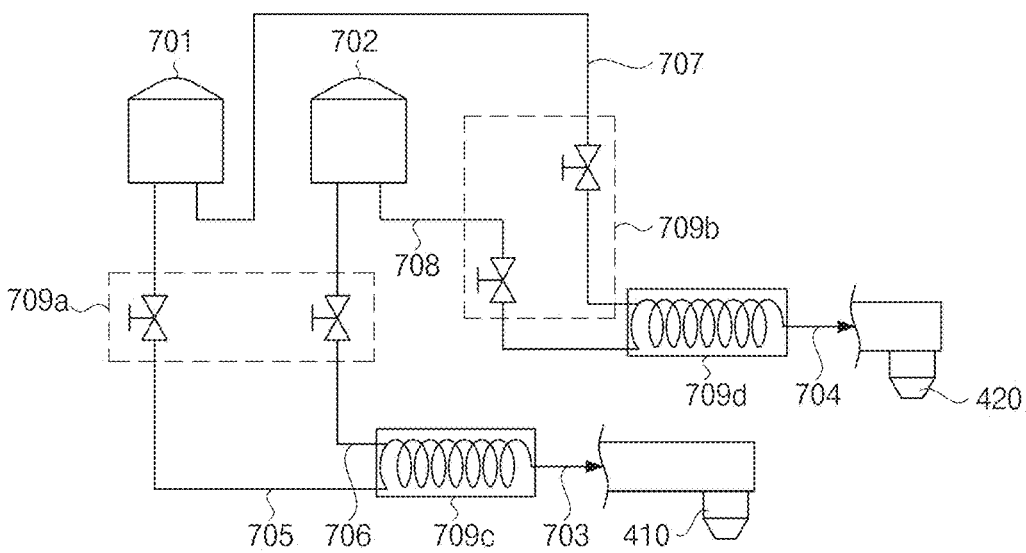
FIG. 4 is a connection diagram schematically illustrating devices connected with a solution discharge unit illustrated in FIG. 2.

FIG. 4 is a connection diagram schematically illustrating devices connected with the solution discharge unit illustrated in FIG. 2.

As illustrated in FIG. 4, the substrate processing apparatus 300 according to one embodiment of the present invention includes a first material tank 701, a second material tank 702, a first supply line 703, a second supply line 704, a first branch line 705, a second branch line 706, a third branch line 707, and a fourth branch line 708, and may further include a first regulator 709a, and a second regulator 709b.

In the first material tank 701, the first material configuring the processing solution is stored. In this case, the first material may include a hydrogen peroxide solution, as exemplified above.

In the second material tank 702, the second material configuring the processing solution is stored. In this case, the second material may include at least one of EKC liquid, BTS liquid, and TNE2 liquid, as described above.

One end of the first supply line 703 is connected to the first nozzle 410.

One end of the second supply line 704 is connected to the second nozzle 420.

The first branch line 705 has one end connected to the first material tank 701 and the other end connected to the first supply line 703. The first branch line 705 supplies the first material to the first supply line 703.

The second branch line 706 has one end connected to the second material tank 702 and the other end connected to the first supply line 703. The second branch line 706 supplies the second material to the first supply line 703.

The third branch line 707 has one end connected to the first material tank 701 and the other end connected to the second supply line 704. The third branch line 707 supplies the second material to the second supply line 704.

The fourth branch line 708 has one end connected to the second material tank 702 and the other end connected to the second supply line 704. The fourth branch line 708 supplies the second material to the second supply line 704.

The first regulator 709a is installed in the first supply line 703 and in at least one of the first branch line 705 and the second branch line 706 to regulate the hydrogen ion concentration of the processing solution discharged from the first nozzle 410 by regulating the amount of mixing of the first material and the second material. As one example of such the first regulator 709a, the first regulator 709a may be variously modified to a flow rate regulating valve, a pressure regulating device, or a discharge volume regulating device capable of regulating the amount of mixing of the first material and the second material discharged from the first nozzle 410 as a matter of course.

The second regulator 709b is installed in at least one of the second supply line 704, the third branch line 707, and the fourth branch line 708, and regulates the hydrogen ion concentration of the processing solution discharged from the second nozzle 420 by regulating the amount of mixing of the first material and the second material. As one example of the second regulator 709b, the second regulator 709b may be variously modified to a flow rate regulating valve, a pressure regulating device, or a discharge volume regulating device capable of regulating the amount of mixing of the first material and the second material discharged from the second nozzle 420 as a matter of course.

Further, the substrate processing apparatus 300 according to the embodiment of the present invention may further include a first line mixer 709c, which is installed between the first regulator 709a and the first nozzle 410, and mixes the first material and the second material to increase the mixing ratio, and a second line mixer 709d installed between the second regulator 709b and the second nozzle 420, which mixes the first material and the second material to increase the mixing ratio.

Further, the substrate processing apparatus 300 according to the embodiment of the present invention may have various additional configurations, such as valves, measurement devices, or filters, in configuring the first material tank 701, the second material tank 702, the first supply line 703, the second supply line 704, the first branch line 705, the second branch line 706, the third branch line 707, the fourth branch line 708, the first regulator 709a, and the second regulator 709b, as a matter of course.

Thus, the substrate processing apparatus 300 according to the embodiment of the present invention includes the first material tank 701, the second material tank 702, the first supply line 703, the second supply line 704, the first branch line 705, the second branch line 706, the third branch line 707, and the fourth branch line 708 to facilitate regulation of the hydrogen ion concentration of the processing solution supplied to the substrate W.

The controller 900 controls the settings of the solution discharge unit 400 to discharge or stop the discharge of the processing solution. In this case, the solution discharge unit 400 may further include an opening and closing valve (not illustrated) so that the processing solution is discharged or the discharge of the processing solution is stopped by the controller 900. The controller 900 is set such that when the solution discharge unit 400 discharges the processing solution to the first position C1 and the second position P1 on the substrate, the hydrogen ion concentration of the processing solution discharged to the first position C1 and the hydrogen ion concentration of the processing solution discharged to the second position P1 are different.

Hereinafter, a method of processing a substrate W by using the substrate processing apparatus as described above will be described.

Figure 5:
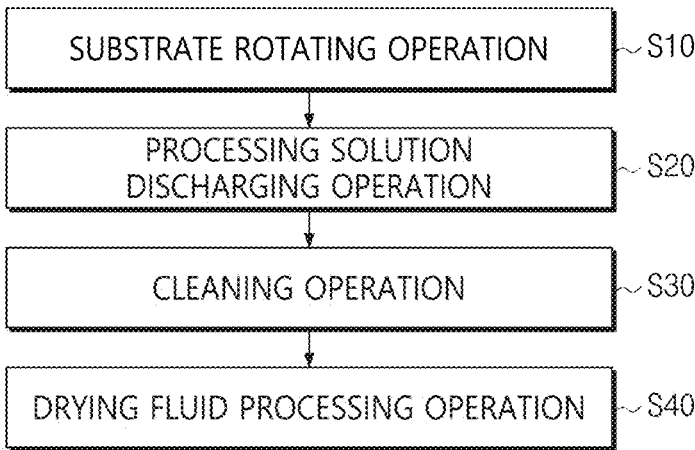
FIG. 5 is a flowchart of a substrate processing method according to an exemplary embodiment of the present invention.

FIG. 5 is a flowchart of a substrate processing method according to an exemplary embodiment of the present invention.

A substrate processing method according to an embodiment of the present invention may include a substrate rotation operation S10 and a processing solution discharge operation S20, and may further include a cleaning operation S30 and a drying fluid processing operation S40.

Figure 3:
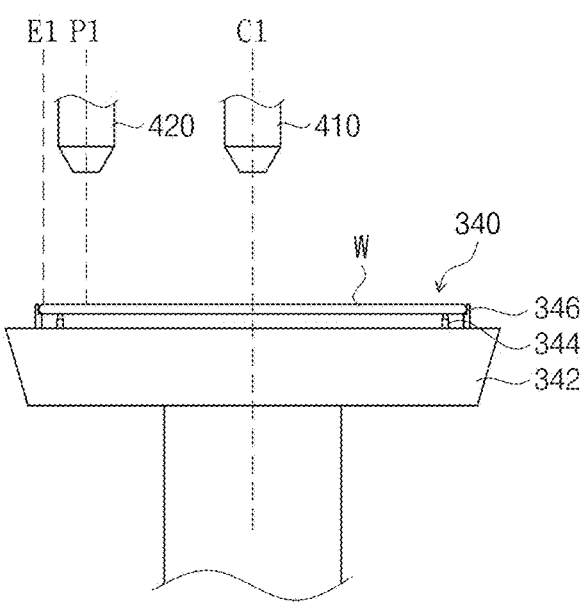
FIG. 3 is an enlarged cross-sectional view of a substrate of the substrate processing apparatus illustrated in FIG. 2.
Figure 6:
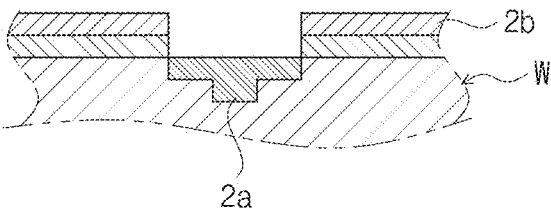
FIG. 6 is an enlarged cross-sectional view of the substrate illustrated in FIG. 3.

In the substrate rotation operation S10, the substrate W is rotated with the substrate W mounted on the top surface of the support unit 340, as illustrated in FIG. 3. In this case, the substrate W may include a copper wiring layer 2a and a TiN layer 2b, which is a hard mask formed around the periphery of the upper portion of the copper wiring layer 2a in a Back-End-Of-Line (BEOL) process, as illustrated in FIG. 6. The processing solution discharged in the processing solution discharge operation S20 may be discharged on the top surface of the TiN layer 2b to etch the TiN layer 2b.

In the processing solution discharge operation S20, the first nozzle 410 and the second nozzle 420 are disposed on the upper region of the rotating substrate W as illustrated in FIG. 3, and the processing solution is discharged on the top surface of the substrate W from each of the first nozzle 410 and the second nozzle 420. In this case, the first nozzle 410 is disposed in the upper portion in the first position C1 of the substrate W, and the second nozzle 420 discharges the processing solution in the upper space of the second position P1 spaced apart from the first position C1 of the substrate W as described above. In this case, the first nozzle 410 and the second nozzle 420 receive the first material and the second material from the first material tank 701 and the second material tank 702 and dispense the processing solutions, respectively, as described above. Further, the processing solution discharged from the first nozzle 410 may have a mixing ratio of the first material and the second material set to a first ratio by the first regulator 709a, and the processing solution discharged from the second nozzle 420 may have a mixing ratio of the first material and the second material set to a second ratio by the second regulator 709b. In this case, the first ratio and the second ratio may be set at different mixing ratios of the first material and the second material, and the first ratio and the second ratio may be set such that the content of the second material is between 5% and 30% of the content of the first material. In this case, the second ratio may be set such that the content of the second material is higher than the content of the second material in the first ratio. For example, the mixing ratio of the processing solution discharged from each of the first nozzle 410 and the second nozzle 420 may be set to the first ratio of 9:1 of the first material to the second material for the first nozzle 410 and the second ratio of 8:2 of the first material to the second material for the second nozzle 420. In this way, the processing solution discharged from the second nozzle 420 to the second position P1 may form a higher hydrogen ion concentration than the processing solution discharged to the first position C1 of the substrate W.

When the processing solution discharge operation S20 is carried out as described above, the TiN layer 2b of the substrate W is oxidized by the processing solution to produce TiO++ oxide, and the TiO++ oxide is dissolved into TiO++·HO$_{2-}$ and TiO++·H$_2$O$_2$ by the processing solution. In this case, the reaction of TiO++ and HO$_{2-}$ proceeds $10^6$ times faster than that of TiO++·H$_2$O$_2$. In this case, HO2− reacts faster as the hydrogen ion concentration of the processing solution is higher, thereby increasing the etching speed at the second position P1, which has the higher hydrogen ion concentration than the first position C1 of the substrate W.

Figure 7:
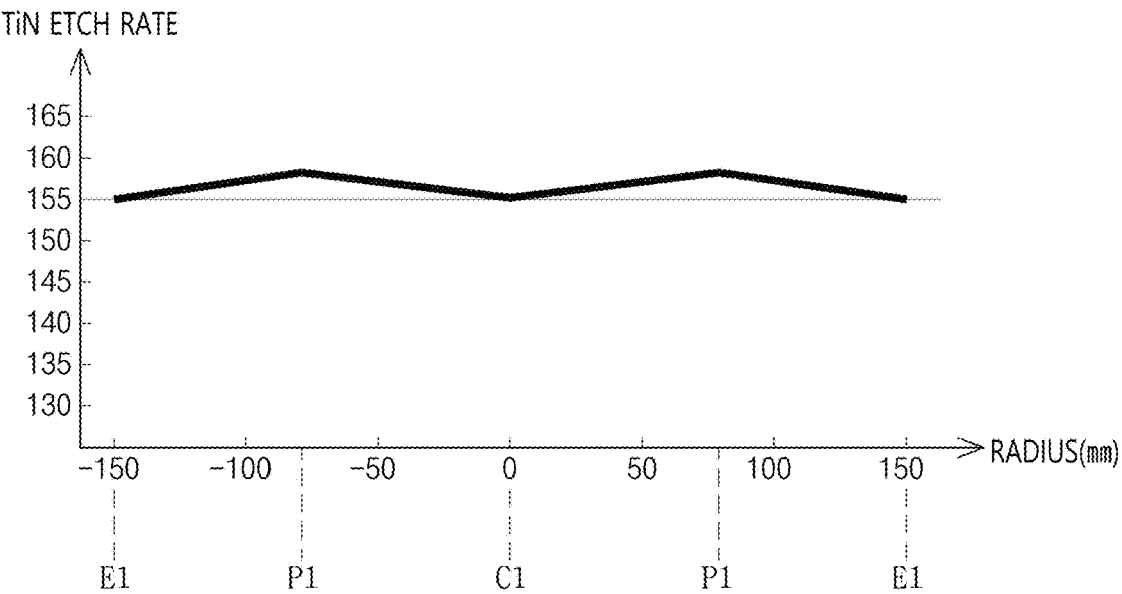
FIG. 7 is a graph showing an etch rate of a TiN layer by area of the substrate when processing the substrate illustrated in FIG. 3.

Accordingly, when examining the etch rate of the TiN layer 2b for each distance from the center of the substrate W with a radius of 150 mm to the edge E1 as illustrated in FIG. 7, the processing solution with a mixing ratio of 8:2 of the first material and the second material increases the etch rate from the second position P1 to the edge E1 of the substrate W. In this case, the processing solution discharged to the first position C1 of the substrate W is set to a mixing ratio of 9:1 of the first material and the second material, which is similar to the etch rate at the second position P1. Therefore, the substrate W has a reduced deviation for the etch rate from the first position C1 to the edge E1 of the substrate W, so that an etching imbalance does not occur.

Figure 8:
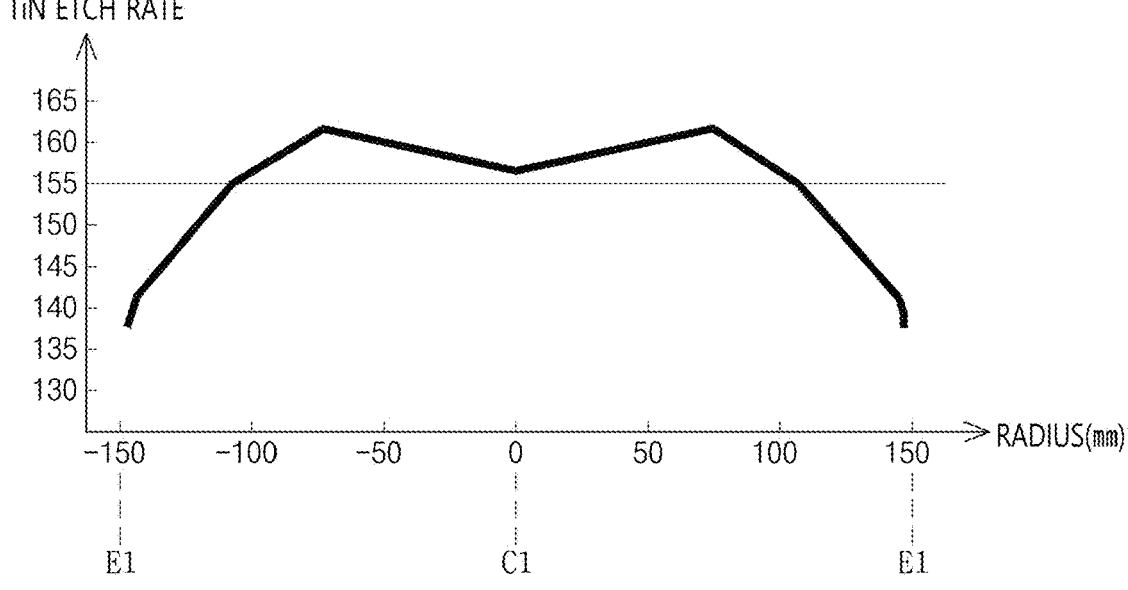
FIG. 8 is a graph showing the etch rate of the TiN layer by area of the substrate when only a first material is discharged at a first position of the substrate illustrated in FIG. 3.

In the meantime, referring to FIG. 7 to investigate a comparative example in which an etch imbalance occurs, FIG. 8 is a graph of the etch rate of the substrate W when the first material is discharged only at the first position C1 of the rotating substrate W. As illustrated in FIG. 8, when investigating the etch rate of the substrate W for the case where the processing solution consists of only the first material, it can be seen that the substrate W with a radius of 150 mm has a relatively large deviation in the etch rate of the TiN layer 2*b* from the first position C1 to the edge E1 of the substrate W compared to the present invention. In the comparative example, a deviation between the maximum etch rate and the minimum etch rate of the substrate W may schematically occur by up to 15%.

On the other hand, the substrate processing apparatus and the substrate processing method according to the embodiments of the present invention may solve the problem of an etching imbalance due to a deviation in the etch rate from the center of the substrate W to the edge E1 by supplying a processing solution with a different hydrogen ion concentration to each area when the etch rate is different in each area of the substrate W.

On the other hand, after the processing solution discharge operation S20, the cleaning operation S30 may be performed by supplying pure water to the substrate W for cleaning, and the processing solution discharge operation S20 and the cleaning operation S30 may be repeatedly performed as necessary. In a subsequent process, the drying fluid processing operation S40 for drying the substrate W by supplying a drying fluid to the substrate W may be further performed.

As described above, the present invention has been described with reference to the specific matters, such as a specific component, limited exemplary embodiments, and drawings, but these are provided only for helping general understanding of the present invention, and the present invention is not limited to the aforementioned exemplary embodiments, and those skilled in the art will appreciate that various changes and modifications are possible from the description.

Therefore, the spirit of the present invention should not be limited to the described exemplary embodiments, and it will be the that not only the claims to be described later, but also all modifications equivalent to the claims belong to the scope of the present invention.

What is claimed is:

1. A substrate processing method of processing a substrate, the substrate processing method comprising:

discharging a processing solution onto a rotating substrate to etch a film on the substrate, wherein the processing solution includes a first material and a second material, and the first material is a material that etches the film, and the second material is a material that activates the first material, the processing solution is discharged to a first location on the substrate and a second location on the substrate, and a hydrogen ion concentration of the processing solution discharged at the first location is set to be different from a hydrogen ion concentration of the processing solution discharged at the second location.

2. The substrate processing method of claim 1, wherein the first position is a center of the substrate, or a position closer to the center of the substrate than the second position, and the hydrogen ion concentration of the processing solution discharged at the second position is higher than the hydrogen ion concentration of the processing solution discharged at the first position.

3. The substrate processing method of claim 1, wherein the first material is a hydrogen peroxide solution, and the second material is an alkaline solution.

4. The substrate processing method of claim 1, wherein the second position is located closer to an edge of the substrate than to a center position of the substrate, among the positions from the center position of the substrate to the edge of the substrate.

5. The substrate processing method of claim 1, wherein a mixing ratio of the first material and the second material in the processing solution discharged at the first position is set to a first ratio, a mixing ratio of the first material and the second material in the processing solution discharged at the second position is set to a second ratio, and the first ratio and the second ratio are set such that a content of the second material is 5% to 30% of a content of the first material.

6. The substrate processing method of claim 5, wherein the second ratio is set such that the content of the second material is higher than the content of the second material in the first ratio.

7. The substrate processing method of claim 1, wherein the film is a TiN layer.

8. A substrate processing method of processing a substrate, the substrate processing method comprising:

discharging a processing solution onto a rotating substrate to etch a TiN film on the substrate, wherein the processing solution includes a hydrogen peroxide solution and an alkaline solution, and the hydrogen peroxide solution is a material for etching the film, and the alkaline solution is a material for activating the hydrogen peroxide solution, the processing solution is discharged to a first location on the substrate and a second location on the substrate, and the first position is a center of the substrate, or a position closer to the center of the substrate than the second position, and the hydrogen ion concentration of the processing solution discharged at the second position is higher than the hydrogen ion concentration of the processing solution discharged at the first position, a mixing ratio of the first material and the second material in the processing solution discharged at the first position is set to a first ratio, a mixing ratio of the first material and the second material in the processing solution discharged at the second position is set to a second ratio, and the first ratio and the second ratio are set such that a content of the second material is 5% to 30% of a content of the first material, and the second ratio is set such that the content of the second material is higher than the content of the second material in the first ratio.

\* \* \* \* \*